(12) United States Patent
Kim et al.

(10) Patent No.: US 8,518,793 B2
(45) Date of Patent: Aug. 27, 2013

(54) OXYGEN DIFFUSION BARRIER COMPRISING RU

(71) Applicant: IMEC, Leuven (BE)

(72) Inventors: Min-Soo Kim, Leuven (BE); Christian Caillat, Wavre (BE); Johan Swerts, Kessel-lo (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/654,167

(22) Filed: Oct. 17, 2012

(65) Prior Publication Data

US 2013/0102121 A1    Apr. 25, 2013

(30) Foreign Application Priority Data

Oct. 21, 2011   (EP) ..................................... 11186243

(51) Int. Cl.
*H01L 21/76*   (2006.01)

(52) U.S. Cl.
USPC ............ 438/396; 257/E21.396; 257/E21.647; 257/E21.664

(58) Field of Classification Search
USPC ............. 438/3, 253, 256, 381, 386, 387, 396; 257/E27.034, E27.048, E27.094, E21.008, 257/E21.396, E21.647, E21.664
See application file for complete search history.

(56) References Cited

U.S. PATENT DOCUMENTS

| | | | |
|---|---|---|---|
| 6,080,594 A | 6/2000 | Choi | |
| 6,146,963 A | 11/2000 | Yu | |
| 6,780,758 B1 | 8/2004 | Derderian et al. | |
| 7,629,221 B2 * | 12/2009 | Park et al. ..................... | 438/386 |
| 7,655,519 B2 * | 2/2010 | Chung et al. .................. | 438/253 |
| 2001/0023955 A1 | 9/2001 | Matsui et al. | |
| 2001/0041402 A1 | 11/2001 | Yamamoto | |
| 2003/0017669 A1 | 1/2003 | Kiyotoshi et al. | |
| 2007/0036892 A1 | 2/2007 | Haukka et al. | |
| 2008/0038920 A1 | 2/2008 | Goswami et al. | |
| 2008/0157278 A1 | 7/2008 | Do et al. | |
| 2009/0065939 A1 | 3/2009 | Suzuki | |
| 2010/0015798 A1 | 1/2010 | Suzuki et al. | |

OTHER PUBLICATIONS

European Search Report, European Patent Application No. 11186243.9 dated Apr. 5, 2012.

* cited by examiner

*Primary Examiner* — Brook Kebede
(74) *Attorney, Agent, or Firm* — McDonnell Boehnen Hulbert & Berghoff LLP

(57) ABSTRACT

A method for forming a MIM capacitor structure includes the steps of obtaining a base structure provided with a recess, the recess exposing a conductive bottom electrode plug; selectively growing Ru on the bottom electrode plug, based on a difference in incubation time of Ru growth on the bottom electrode plug compared to the base structure material; oxidizing the selectively grown Ru; depositing a Ru-comprising bottom electrode over the oxidized Ru; forming a dielectric layer on the Ru-comprising bottom electrode; and—forming a conductive top electrode over the dielectric layer.

20 Claims, 4 Drawing Sheets

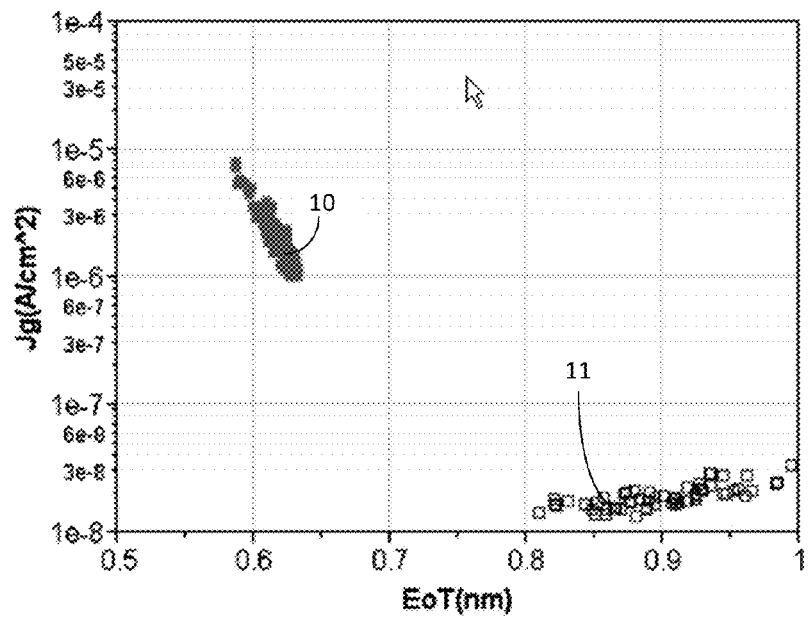
FIG. 1 – PRIOR ART
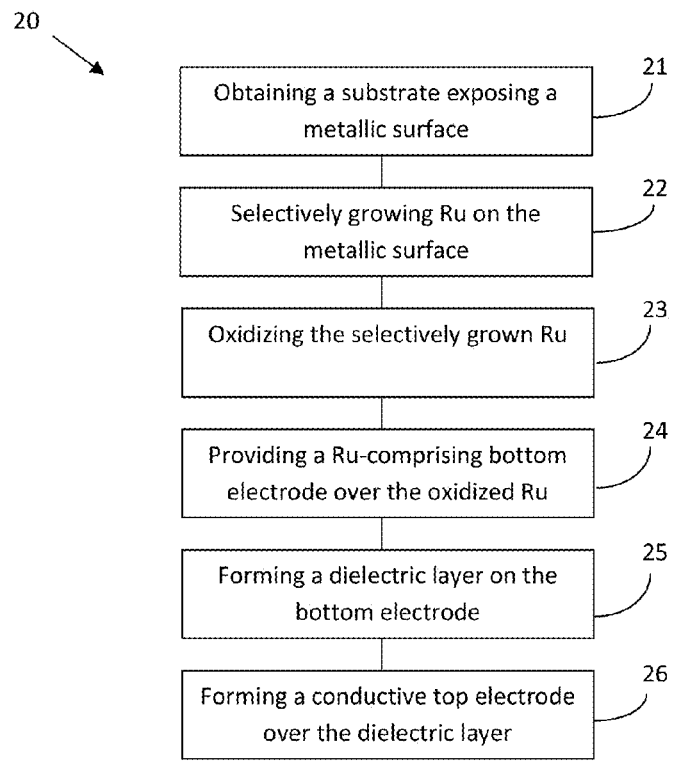
FIG. 2

OXYGEN DIFFUSION BARRIER COMPRISING RU

CROSS REFERENCE TO RELATED APPLICATIONS

This application claims the benefit of priority of European Patent Application no. 11186243.9, filed Oct. 21, 2011, which is hereby incorporated herein by reference in its entirety.

BACKGROUND OF THE INVENTION

1. Field of the Invention

The present invention relates to the field of semiconductor devices, more particularly to the field of semiconductor memory devices, e.g. capacitor structures. More particularly the present invention relates to a method to selectively form Ru and/or $RuO_2$ as an oxygen diffusion barrier in such memory devices, and to memory devices provided with such Ru-based diffusion barrier.

2. Technical Background

For future MIM (metal-insulator-metal) capacitor devices, Ru and $RuO_2$ are the most interesting candidates to replace current TiN bottom and top electrodes. It has been suggested that $RuO_2$ is more likely a candidate thanks to $RuO_2$ reduction to Ru releasing $O_2$ into the capacitor dielectric to help suppress capacitor leakages at the operation voltage through high-k material such as e.g. $SrTiO_3$.

In the choice of $RuO_2$ film formation, however, converting Ru to $RuO_2$ by oxidation could generate some rough surface morphology which in turn degrades leakage current. On top thereof, CVD Ru or an as-deposited $RuO_2$ process could oxidize the substrate, including the plug/barrier metal thus making a higher contact resistance. Up to now, TiN has been used most widely as oxidation barrier, but with the new Ru or $RuO_2$ as bottom and/or top electrodes, stronger oxidation barriers than TiN are needed in order to prevent oxidation of underlying metals during metal or metal oxide deposition in an oxidizing ambient.

SUMMARY OF THE INVENTION

In certain aspects, the present invention can provide a strong oxidation barrier before a $RuO_2$ provision. This can be accomplished by a method according to certain embodiments of the present invention.

In one aspect, the present invention provides a method for forming a MIM capacitor structure. The method comprises the steps of:
  obtaining a base structure provided with a recess, the recess exposing a conductive bottom electrode plug,
  selectively growing Ru on the bottom electrode plug, based on a difference in incubation time of Ru growth on the bottom electrode plug compared to the base structure material,
  oxidizing the selectively grown Ru,
  depositing a Ru-comprising bottom electrode over the oxidized Ru,
  forming a dielectric layer on the Ru-comprising bottom electrode, and
  forming a conductive top electrode over the dielectric layer.

It is an advantage of methods according to certain embodiments of the present invention that they provide reduced EOT, reduced leakage current Jg and/or reduced contact resistance between storage node and electrical contact plug, when compared to prior art methods for forming MIM capacitor structures.

In a method according to one type of embodiments of the present invention, forming a MIM capacitor structure may include forming an inner capacitor, i.e. a capacitor in a recess.

In a method according to certain embodiments of the present invention for forming an inner capacitor, depositing a Ru-comprising bottom electrode may comprise conformal deposition of a Ru-comprising material layer in the recess. Forming a conductive top electrode may then comprise deposition and etch back of a conductive material layer, thus substantially completely filling the recess with conductive material.

In a method according to an alternative type of embodiments, forming a MIM capacitor structure may include forming an outer capacitor, i.e. a capacitor structure sticking out from the base structure.

In a method according to certain embodiments of the present invention, depositing a Ru-comprising bottom electrode may comprise deposition and etch back of a Ru-comprising material layer, thus substantially completely filling the recess with Ru-comprising material. A method according to embodiments of the present invention may further comprise, before forming the conductive top electrode, removing side walls defining the recess.

In a method according to certain embodiments of the present invention, oxidizing the selectively grown Ru may include an oxidation step performed below 500° C.

In a method according to certain embodiments of the present invention, forming a dielectric layer may comprise forming a high-k dielectric layer.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain advantages of the invention have been described herein above. Of course, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 1 illustrates that the bottom electrode shows an EOT shift when using CVD Ru as bottom plate of a MIM capacitor in an oxidizing ambient on top of a TiN plug, indicating oxidation of the TiN plug.

FIG. 2 is a generic flow chart illustrating basic steps of a method according to embodiments of the present invention.

Figure 3:
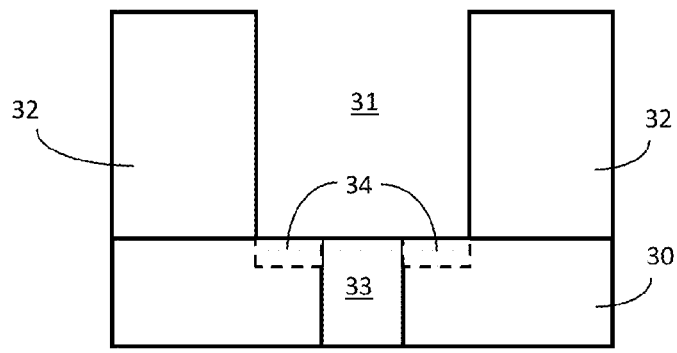
FIG. 3 to FIG. 7 illustrate a sequence of method steps which may be used in accordance with a first embodiment of the present invention to form an internal MIM capacitor.
Figure 4:
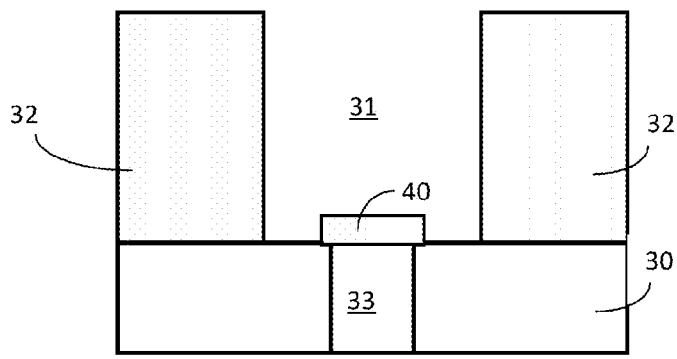
Figure 5:
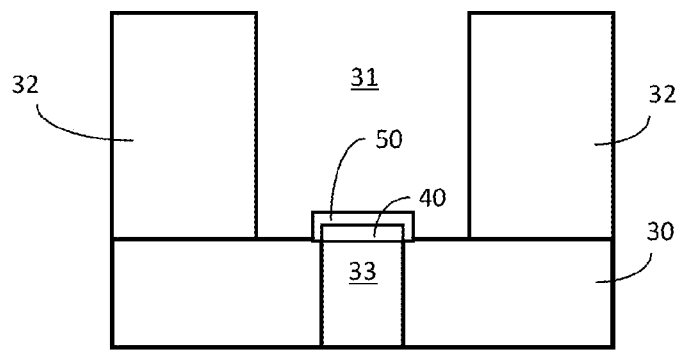

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B. It means that with respect to the present invention, the only required components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the present invention, MIM relates to a structure comprising a first metal layer, an insulating layer and a second metal layer. Such structure forms a capacitor. The capacitance of a MIM capacitor structure may be affected by several variables including the thickness of the dielectric layer, which may be adversely affected by processing conditions.

In the context of the present invention, an oxygen barrier is a layer which substantially blocks or completely blocks oxygen from diffusing, hence which protects a neighboring, e.g. underlying, layer by preventing oxidation thereof.

In a first aspect, the present invention relates to a method of manufacturing a MIM capacitor structure.

Currently, MIM capacitors may be made for example by sputtering metal for bottom and top plates, and providing a dielectric layer in between. The bottom plate may for example be Metal 0, the first layer of local interconnect, which is connected to an electrical supply via a conductive plug, for example a TiN or W plug.

It has been shown by the present inventors that, when using CVD Ru in an oxidizing ambient as top plate of the MIM capacitor on top of high-k/TiN layers, that the bottom electrode showed an EOT shift by about 0.4 to 0.6 nm—see FIG. 1, which shows on the one hand, indicated by 10, measurements of leakage current Jg in function of equivalent oxide thickness EoT for a capacitor device consisting of a TiN bottom electrode, a Sr-rich 9 nm STO dielectric, and a CVD Ru top electrode; and on the other hand, indicated by 11, measurements of leakage current in function of EoT for a capacitor device consisting of a TiN bottom electrode, a Sr-rich 9 nm STO dielectric, and a TiN top electrode. This supports that TiN oxidation resistance is not enough to prevent oxidation of the bottom electrode from happening during a CVD Ru process.

A flow chart of a method 20 according to embodiments of the present invention is illustrated in FIG. 2.

In a first embodiment of the present invention, a method is proposed for forming an inner MIM capacitor structure. This means that a capacitor storage node container is provided, e.g. a recess or a trench in a substrate, in which a capacitor structure is provided.

FIG. 3 to FIG. 7 illustrate different steps in a method according to the first embodiment of the present invention.

In a first step 21, a base structure 30 is obtained, comprising a capacitor storage node container 31. In embodiments of the present invention, the term "base structure" 30 may include any underlying material or materials that may be used, or upon which a capacitor structure in accordance with embodiments of the present invention may be formed. In particular embodiments, this base structure 30 may include a semiconductor substrate such as e.g. doped or undoped silicon, a gallium arsenide (GaAs), a gallium arsenide phosphide (GaAsP), an indium phosphide (InP), a germanium (Ge), or a silicon germanium (SiGe) substrate. The base structure 30 may include for example an insulating layer such as a $SiO_2$ or a $Si_3N_4$ layer in addition to a semiconductor substrate portion. Thus, the term base structure also includes semiconductor-on-glass, e.g. silicon-on-glass, or semiconductor-on-sapphire, e.g. silicon-on-sapphire structures. The term base structure is thus used to define generally the elements for layers that underlie a layer or portions of interest. Also, the base structure 30 may be any other base on which a layer is formed, for example a glass or metal layer.

The capacitor storage node container 31 is a recess which will be used for forming the capacitor. The capacitor storage node container 31 may be a hole or a trench made in the base structure 30 or in one or more layers provided on the base structure 30. In embodiments of the present invention, the capacitor storage node container 31 is made in an insulating layer, on which Ru hardly grows (due to very long nucleation times of Ru on insulating layers). As an example, in the embodiment illustrated a dielectric layer such as a $SiO_2$ layer 32 is provided on the base structure 30, and a capacitor storage node container 31 is made in the dielectric, e.g. $SiO_2$, layer 32. In embodiments of the present invention, the capacitor storage node container 31 is thus made in an insulator material, which may either be material of the base structure, or one or more layers of material provided on the material forming the base structure. In accordance with the first embodiment of the present invention, a capacitor structure with a bottom plate and a top plate, separated from one another by means of dielectric material, will be formed in the capacitor storage node container 31. A plug 33 of conductive material is formed in the base structure 30, for electrically contacting the bottom plate of the capacitor structure. The plug 33 may for example be a via. The plug may for example be made from TiN or W.

At least an upper surface of the plug 33 is revealed in the capacitor storage node container 31. Optionally, a recess 34 may be provided in the base structure, around the plug 33. This way, an upper portion of the conductive plug 33 is revealed in the capacitor storage node container 31.

It is known that Ru has a characteristic feature of selective growth such that although it hardly grows on insulating materials, it may grow on conductive materials, e.g. metallic materials such as nitrides, e.g. TiN. More growth delays have been observed on oxide substrates than on metal substrates. In a second step 22 of a method according to the first embodiment of the present invention, a layer 40 of Ru is selectively grown on the conductive material revealed in the capacitor storage node container 31, more particularly in the embodiment illustrated in FIG. 4 on the top surface of the plug 33. In embodiments of the present invention, the thickness of the grown Ru layer may be about 5 nm. The Ru layer 40 may for example be provided by chemical vapor deposition (CVD), atomic layer deposition (ALD) or plasma enhanced atomic layer deposition (PEALD). Both ALD and PEALD are surface controlled layer-by-layer processes for the deposition of material with atomic layer precision. PEALD makes use of RF-plasma activated rather than thermally-activated reaction, hence can be carried out at lower temperatures compared to conventional ALD. PEALD Ru can for example be grown in a temperature range of typically 200° C. to 450° C., using a $H_2(N_2)$ or $NH_3(N_2)$ containing plasma. It can be done with various Ru chemistries. The selectivity of the growing of Ru is based on a difference in incubation time of Ru growth on the metallic material compared to the dielectric material. This means that in the embodiment illustrated, a layer of Ru 40 will substantially only be grown on top of the conductive plug 33 and not elsewhere in the capacitor storage node container 31, hence not on the sidewalls thereof. With "substantially only" is meant that some traces of Ru (isolated nucleation centers) will be found on the dielectric material of the capacitor storage node container 31, but certainly not a continuous layer.

In a third step 23, the selectively grown Ru 40 is at least partially oxidized to form a layer 50 of $RuO_2$. The oxidation may be as much as possible since $RuO_2$ is a conductive material, without substantially affecting the plug 33. Once the $RuO_2$ layer is formed it functions as oxidation barrier against further oxidation of the underlying layer. Hereto, the Ru-layer 40 may be subjected to a low-pressure atmosphere consisting of $O_2$ or consisting of a mixture of $O_2$ and one or more inert gases such as $N_2$. The pressure or partial pressure of $O_2$ may be between 1 mTorr and 10 Torr (i.e. between 0.13 Pa and 1333.22 Pa). This oxidation may be performed at low temperature, e.g. below 500° C., for example between 200° C. and 450° C., such as for example below 300° C., e.g. about 250° C. The oxidation time may be between 1 min and 30 min, with lower oxidation times being applicable for higher temperatures. $RuO_2$ is more stable than Ru as it has more oxidation resistance.

Figure 6:
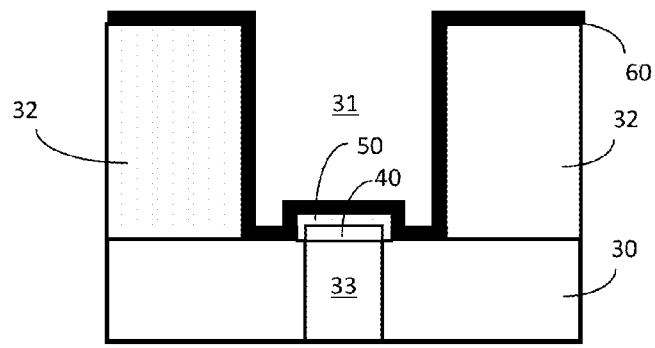
Figure 7:
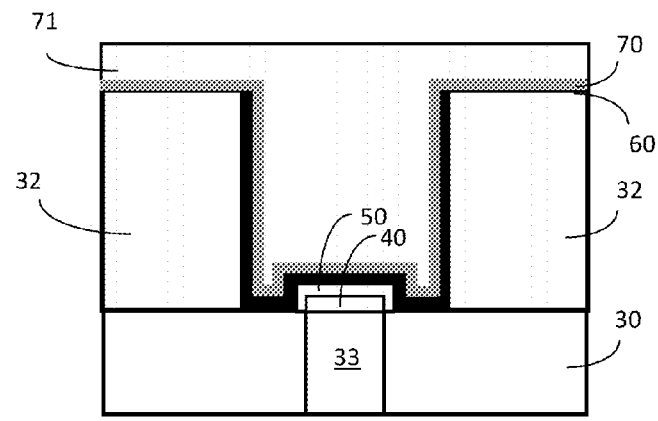
Figure 8:
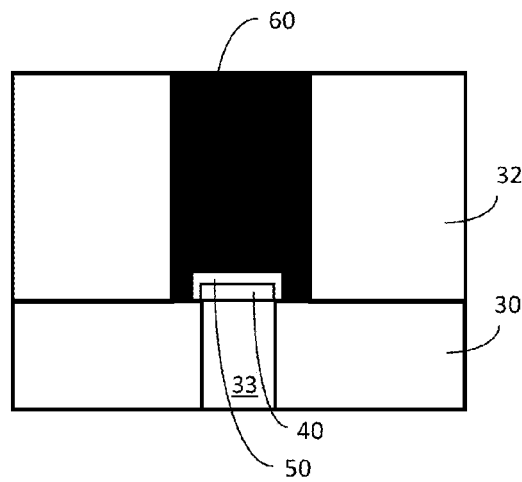
FIG. 8 and FIG. 9 illustrate a sequence of method steps which may be used after performing the method steps illustrated in FIG. 3 to FIG. 5 in accordance with a second embodiment of the present invention to form an external MIM capacitor.
Figure 9:
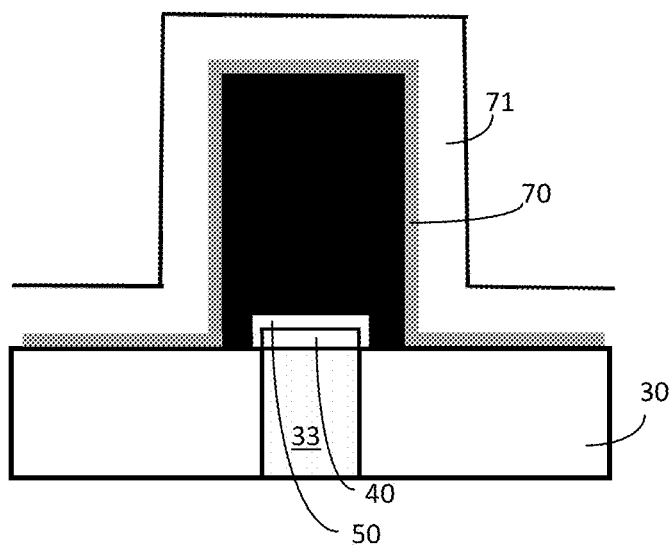

In a fourth step 24, the bottom electrode 60 of the capacitor structure to be formed is formed over the oxidized Ru layer 50. This bottom electrode 60 may be formed from Ru-based material, such as Ru or $RuO_2$, although the invention is not limited thereto. The bottom electrode 60 may be formed in any suitable way. In particular embodiments, for example as illustrated in FIG. 6, this bottom electrode 60 may be formed by conformal deposition by chemical vapor deposition (CVD). During this deposition of bottom electrode material, e.g. Ru or $RuO_2$, the formerly formed oxidized Ru layer 50 is used as a strong oxidation barrier, preventing the underlying plug material from oxidizing. This provides a low contact resistance to the underlying conductive plug 33. In the embodiment illustrated in FIG. 6, the bottom electrode 60 has a thickness of a few nm, for example between 2 and 5 nm.

On the bottom electrode 60, in a fifth step 25 a dielectric layer 70 is formed. This dielectric layer 70 may be a high-k dielectric layer such as for example a layer comprising or consisting of strontium titanate (STO; $SrTiO_3$), hafnium dioxide ($HfO_2$) or zirconium dioxide ($ZrO_2$). The dielectric layer may be formed in any suitable way, for example by atomic layer deposition or CVD.

Over the dielectric layer 70, in a sixth step 26 a conductive top electrode 71 is formed. This conductive top electrode may be formed from same materials as the bottom electrode 60. The material of the bottom electrode 60 and the material of the top electrode 71 of a single capacitor may be, but does not need to be, the same. The top electrode may be formed in any suitable way, for example by deposition and patterning of a suitable layer of material. By depositing the top electrode, the remainder of the capacitor storage node container 31 may be at least partially filled, for example completely filled. The top electrode 71 may even be formed over at least part of the base structure 30 or dielectric layer 32.

On top of the above steps, further processing may be done in a conventional way for electrically connecting to the top electrode 71, to provide other structures on the same wafer and/or to passivate the obtained structures, etc.

This completes formation of the internal MIM capacitor structure according to the first embodiment of the present invention.

In a second embodiment of the present invention, a method is proposed for forming an outer MIM capacitor structure. This means that a structure sticking out of a base structure is provided, over which a capacitor structure is provided.

The method according to the second embodiment of the present invention comprises a plurality of method steps, illustrated with respect to FIG. 3 to FIG. 5 and FIG. 8 and FIG. 9.

The first steps 21, 22 and 23 are as in the method according to the first embodiment of the present invention, and therefore are not recited here. Similar materials and similar methods may be used.

Once the storage node container provided with selectively grown Ru on the bottom electrode plug, based on a difference in incubation time of Ru growth on the bottom electrode plug compared to the material of the base structure, which thereafter is oxidized, in a step 24 a bottom electrode 60 is provided. In this second method embodiment, providing the bottom electrode 60 comprises substantially completely, e.g. completely, filing the storage node container 31. This may be done in any suitable way, e.g. by depositing Ru-based material, such as Ru or $RuO_2$ over substantially the whole base structure, including the storage node container, and removing, e.g. etching back, this bottom electrode material from locations where it should not be present. During this deposition of Ru or $RuO_2$, the formerly formed oxidized Ru layer 50 is used as a strong oxidation barrier, preventing the underlying plug material from oxidizing. This provides a low contact resistance to the underlying conductive plug 33.

Thereafter, parts of the base structure 30 or one or more other dielectric layers defining the storage capacitor node, i.e. the recess which has been filled with bottom electrode material 60 in the previous step, are removed, for example by selective etching. Such selective etching may include using chemistry selective to Ru and $RuO_2$. This way, a free-standing, upstanding structure is formed from bottom electrode material on the base structure 30, surrounded by at least a gap where other materials can be provided.

Over the bottom electrode 60, in a fifth step 25 a dielectric layer 70 is formed. This dielectric layer 70 may be a high-k dielectric layer such as for example a layer comprising or consisting of strontium titanate (STO; $SrTiO_3$), hafnium dioxide ($HfO_2$) or zirconium dioxide ($ZrO_2$). The dielectric layer may be formed in any suitable way, for example by atomic layer deposition or CVD.

Over the dielectric layer 70, in a sixth step 26 a conductive top electrode 71 is formed. This conductive top electrode may be formed from same materials as the bottom electrode 60. The material of the bottom electrode 60 and the material of the top electrode 71 of a single capacitor may be, but does not need to be, the same. The top electrode may be formed in any suitable way, for example by conformal deposition and patterning of a suitable layer of material.

On top of the above steps, further processing may be done in a conventional way for electrically connecting to the top electrode 71, to provide other structures on the same wafer and/or to passivate the obtained structures, etc.

This completes formation of the external MIM capacitor structure according to the second embodiment of the present invention.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. A method for forming a MIM capacitor structure, comprising
    obtaining a base structure provided with a recess, the recess exposing a conductive bottom electrode plug,
    selectively growing Ru on the bottom electrode plug, based on a difference in incubation time of Ru growth on the bottom electrode plug compared to the base structure material,
    oxidizing the selectively grown Ru,
    depositing a Ru-comprising bottom electrode over the oxidized Ru,
    forming a dielectric layer on the Ru-comprising bottom electrode, and
    forming a conductive top electrode over the dielectric layer.

2. A method according to claim 1, wherein forming the MIM capacitor structure includes forming an inner capacitor.

3. A method according to claim 2, wherein depositing the Ru-comprising bottom electrode comprises conformal deposition of a Ru-comprising material layer in the recess.

4. A method according to claim 3, wherein forming the conductive top electrode comprises deposition and etch back of a conductive material layer, thereby substantially completely filling the recess with conductive material.

5. A method according to claim 1, wherein forming the MIM capacitor structure includes forming an outer capacitor.

6. A method according to claim 5, wherein depositing the Ru-comprising bottom electrode comprises deposition and etch back of a Ru-comprising material layer, thereby substantially completely filling the recess with Ru-comprising material.

7. A method according to claim 5, wherein the recess is defined by side walls, and further comprising, before forming the conductive top electrode, removing the side walls defining the recess.

8. A method according to claim 1, wherein oxidizing the selectively grown Ru includes an oxidation below 500° C.

9. A method according to claim 1, wherein forming the dielectric layer comprises forming a high-k dielectric layer.

10. A method according to claim 9, wherein the high-k dielectric layer comprises strontium titanate (STO; $SrTiO_3$), hafnium dioxide ($HfO_2$) or zirconium dioxide ($ZrO_2$).

11. A method according to claim 4, wherein oxidizing the selectively grown Ru includes an oxidation below 500° C.

12. A method according to claim 6, wherein oxidizing the selectively grown Ru includes an oxidation below 500° C.

13. A method according to claim 7, wherein oxidizing the selectively grown Ru includes an oxidation below 500° C.

14. A method according to claim 3, wherein oxidizing the selectively grown Ru includes an oxidation below 500° C.

15. A method according to claim 3, wherein forming the dielectric layer comprises forming a high-k dielectric layer.

16. A method according to claim 4, wherein forming the dielectric layer comprises forming a high-k dielectric layer.

17. A method according to claim 16, wherein the high-k dielectric layer comprises strontium titanate (STO; $SrTiO_3$), hafnium dioxide ($HfO_2$) or zirconium dioxide ($ZrO_2$).

18. A method according to claim 6, wherein forming the dielectric layer comprises forming a high-k dielectric layer.

19. A method according to claim 18, wherein the high-k dielectric layer comprises strontium titanate (STO; $SrTiO_3$), hafnium dioxide ($HfO_2$) or zirconium dioxide ($ZrO_2$).

20. A method according to claim 7, wherein forming the dielectric layer comprises forming a high-k dielectric layer.

* * * * *